(12) United States Patent
Kim et al.

(10) Patent No.: US 7,867,630 B2
(45) Date of Patent: Jan. 11, 2011

(54) WHITE ORGANIC ELECTROLUMINESCENT DEVICE AND METHOD OF MANUFACTURING THE SAME

(75) Inventors: Yu-Jin Kim, Yongin-si (KR); Jhun-Mo Son, Yongin-si (KR); Jong-Jin Park, Yongin-si (KR); Sang-Hoon Park, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1018 days.

(21) Appl. No.: 11/699,008

(22) Filed: Jan. 29, 2007

(65) Prior Publication Data

US 2007/0273273 A1 Nov. 29, 2007

(30) Foreign Application Priority Data

May 23, 2006 (KR) ................ 10-2006-0046285

(51) Int. Cl.
*H01L 51/54* (2006.01)
*H05B 33/14* (2006.01)
*C09K 11/06* (2006.01)

(52) U.S. Cl. ............ 428/690; 428/917; 313/504; 313/506; 257/40; 257/103

(58) Field of Classification Search ............ 313/504, 313/506; 257/40, 103; 428/690, 917
See application file for complete search history.

(56) References Cited

U.S. PATENT DOCUMENTS 6,368,732 B1 * 4/2002 Jin et al. ............... 428/690
6,605,904 B2 8/2003 Jenekhe et al.
2005/0208332 A1 9/2005 Chin et al.
2006/0202616 A1 * 9/2006 Gong et al. ............ 313/506
2006/0269779 A1 11/2006 Takahashi et al.
2007/0003787 A1 * 1/2007 Lee et al. ............... 428/690

FOREIGN PATENT DOCUMENTS

WO WO 2006094101 A1 * 9/2006

OTHER PUBLICATIONS

Jin et al. Chem. Mater. 2002, 14, 643-650.*
Chinese Office Action issued by the Chinese Patent Office on Jan. 15, 2010 corresponding to Chinese Patent Application No. 2007100021686 with English Translation attached.

* cited by examiner

*Primary Examiner*—David Wu
*Assistant Examiner*—Vu A Nguyen
(74) *Attorney, Agent, or Firm*—Robert E. Bushnell, Esq.

(57) ABSTRACT

Provided is a white organic electroluminescent (EL) device including multiple polymer light emitting layers. a white organic electroluminescent device includes a first polymer light-emitting layer and a second polymer light-emitting layer, both of which are formed between a first electrode and a second electrode. A highest occupied molecular orbital (HOMO) energy level of the first polymer light-emitting layer is in the range 5.0 eV through 5.4 eV, and a HOMO energy level of the second polymer light-emitting layer is higher than the HOMO energy level of the first polymer light-emitting layer. Colors emitted from both of the first and second polymer light-emitting layers are combined to produce a white color.

17 Claims, 5 Drawing Sheets

FIG. 2A

| SECOND ELECTRODE |
| --- |
| SECOND POLYMER LIGHT-EMITTING LAYER |
| FIRST POLYMER LIGHT-EMITTING LAYER |
| HOLE INJECTION LAYER |
| FIRST ELECTRODE |
| SUBSTRATE |

FIG. 2B

| SECOND ELECTRODE |
| --- |
| SECOND POLYMER LIGHT-EMITTING LAYER |
| THIRD POLYMER LIGHT-EMITTING LAYER |
| FIRST POLYMER LIGHT-EMITTING LAYER |
| HOLE INJECTION LAYER |
| FIRST ELECTRODE |
| SUBSTRATE |

WHITE ORGANIC ELECTROLUMINESCENT DEVICE AND METHOD OF MANUFACTURING THE SAME

CLAIM OF PRIORITY

This application makes reference to, incorporates the same herein, and claims all benefits accruing under 35 U.S.C. §119 from an application for WHITE ORGANIC LIGHT-EMITTING DEVICE AND THE METHOD FOR PREPARING THE SAME earlier filed in the Korean Intellectual Property Office on 23 May 2006 and there duly assigned Serial No. 10-2006-0046285.

BACKGROUND OF THE INVENTION

1. Field of the Invention

The present invention relates to a white organic electroluminescent device and a method of manufacturing the same, and more particularly, to a white organic electroluminescent device including a plurality of polymer light-emitting layers formed using a wet process, and a method of manufacturing the same.

2. Description of the Related Art

Organic electroluminescent (EL) devices are known for their high visibility due to their self-luminous characteristics, and for their superior anti-shock properties because they are made of solid state elements. So, utilizing the EL device as display devices has attracted considerable attention.

Organic EL devices basically include an anode, an organic light-emitting layer, a cathode, and optionally include a hole injection layer (HIL), a hole transport layer (HTL) or an electron injection layer (EIL). A typical organic EL device can have a structure including an anode, a HIL, a HTL, an organic light-emitting layer and a cathode, or can have another structure including an anode, a HIL, a HTL, an organic light-emitting layer, an EIL, and a cathode.

Recently, development of organic EL devices for display devices has been accelerated, in particular the development of a white organic electroluminescent device has been intensively accelerated. White organic EL devices are organic light-emitting devices which emit white light, and can be used as paper-thin light sources or backlights of liquid crystal displays (LCDs), or also can be used as full-color displays by adopting color filters.

A white organic EL device can include either a single light-emitting layer or a plurality of light-emitting layers. A white organic EL device with a single light-emitting layer can be manufactured either by using a single material or by doping or blending two or more materials in the light-emitting layer. One method uses a blue host, and red and green dopants. Another method uses a host material of large energy band gap, doped with red, green and blue dopants. However, energy transfer to dopants is incomplete in those methods. Also, another method that uses a bipolar host material, which has a red, green, or blue light emitting moiety, has a disadvantage that the adjustment of white balance is difficult.

White organic EL devices having a plurality of light-emitting layers can be classified into two types: a three-wavelength type and a two-wavelength type. The three-wavelength type white organic EL device includes stacked layers, which emits red (R), green (G), and blue (B) light, respectively. The two-wavelength type white organic EL device uses lights of complementary color. In the three-wavelength type white organic EL device, a method of manufacturing a plurality of light-emitting layers, which are made of materials of low molecular weight, has been tested, but in this method, it is difficult to control the diffusion of excitons and the thickness of each layer.

The two-wavelength type white organic EL device uses a combination of blue and yellow color, or bluish green and orange color, and the two-wavelength type white organic EL device has high efficiency compared to the RGB three-wavelength stacked layer type. However, there are still difficulties in controlling the diffusion of excitons and the thickness of each layer because of the materials of low molecular weight used in manufacturing the two-wavelength type white organic EL device. Therefore, a white organic EL device which improves the manufacturing process and maintains high efficiency of the organic EL device is required.

SUMMARY OF THE INVENTION

In order to solve the above mentioned problems, the present invention provides a white organic electroluminescent (EL) device made of polymer light-emitting layers. White color can be achieved by combining colors emitted from multiple polymer light-emitting layers. The polymer light-emitting layer can be formed by a wet process, and therefore the thickness of the polymer light-emitting layer can be easily controlled, while maintaining high efficiency. As discovered during experiments, spectrum of light emitted from the polymer light-emitting layer depends on the thickness of the polymer light-emitting layer, and white balance can be adjusted by changing the thickness of the polymer light-emitting layer. Therefore, adjustment of white balance can be easily achieved. The organic EL device of the present invention also provides excellent color performance and stability.

The white organic electroluminescent (EL) device of the present invention includes a first electrode, a second electrode, a first polymer light-emitting layer disposed between the first electrode and the second electrode, and a second polymer light-emitting layer disposed between the first polymer light-emitting layer and the second electrode.

A highest occupied molecular orbital (HOMO) energy level of the first polymer light-emitting layer is between 5.0 eV and 5.4 eV, and a highest occupied molecular orbital (HOMO) energy level of the second polymer light-emitting layer is higher than the HOMO energy level of the first polymer light-emitting layer. Specifically, the HOMO energy level of the second polymer light-emitting layer can be between 5.4 eV and 5.8 eV. An energy band gap of the first polymer light-emitting layer is between 1.9 eV and 2.2 eV, and an energy band gap of the second polymer light-emitting layer is larger than the energy band gap of the first polymer light-emitting layer. Specifically the energy band gap of the second polymer light-emitting layer is no less than 2.5 eV.

The white organic EL device of the present invention can further includes a third polymer light-emitting layer disposed between the first polymer light-emitting layer and the second polymer light-emitting layer. A highest occupied molecular orbital (HOMO) energy level of the third polymer light-emitting layer is higher than the HOMO energy level of the first polymer light-emitting layer, and is lower than the HOMO energy level of the second polymer light-emitting layer. An energy band gap of the third polymer light-emitting layer is between 2.2 eV and 2.5 eV.

BRIEF DESCRIPTION OF THE DRAWINGS

The above and other features and advantages of the present invention will become more apparent by describing in detail exemplary embodiments thereof with reference to the attached drawings in which:

FIGS. 2A and 2B illustrate sectional views of white organic electroluminescent (EL) devices constructed as embodiments of the present invention;

DETAILED DESCRIPTION OF THE INVENTION

Figure 1:
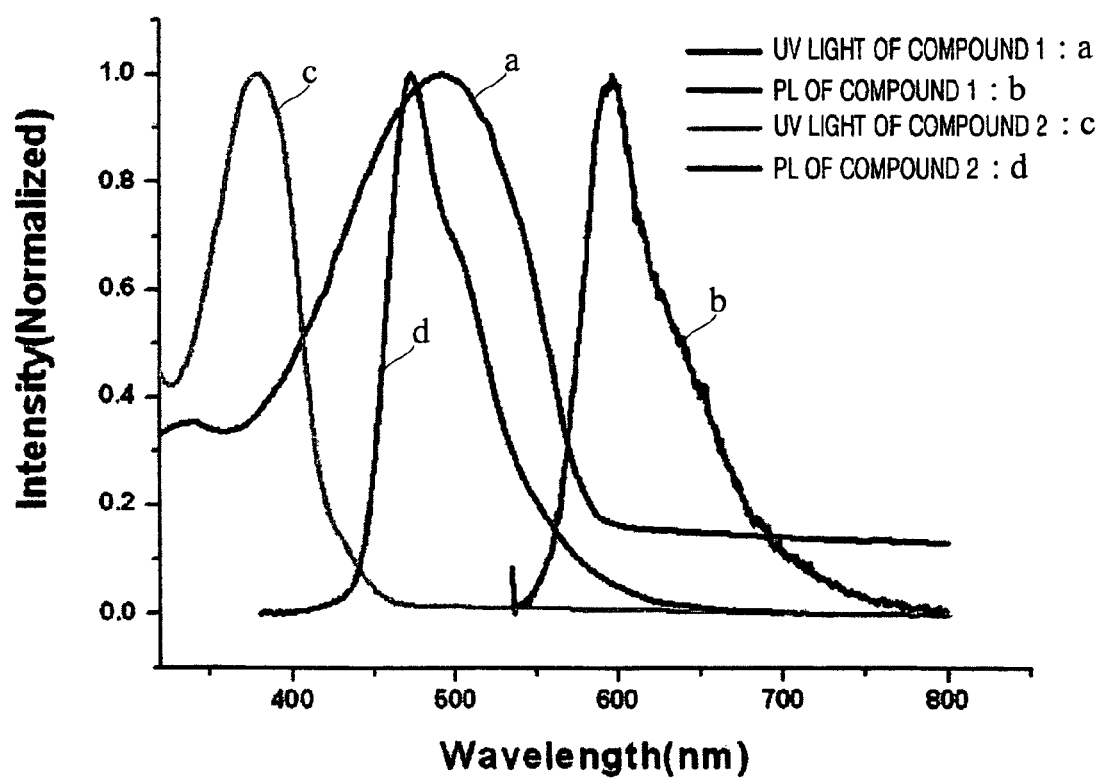
FIG. 1 is a graph showing the intensity of absorption and photoluminescence (PL) of Compounds 1 and 2 prepared for embodiments of the present invention.

Hereinafter, the present invention will be described in detail by explaining embodiments of the invention with reference to the attached drawings.

The present invention provides a white organic electroluminescent (EL) device including a first polymer light-emitting layer and a second polymer light-emitting layer, both of which are formed between a first electrode and a second electrode. Both of the first and second polymer light-emitting layers are formed by a wet process. Herein, the wet process means that the basic material for the polymer light-emitting layer is provided in a form of liquid or solution. One example of the wet process is a spin-coating process. In a spin-coating process, a solution, which contains the material for the polymer light-emitting layer, is applied to a substrate, and the solution spreads over the surface of the substrate by spinning the substrate. The solution-coated substrate is, then, dried, and the polymer light-emitting layer is formed on the substrate.

The highest occupied molecular orbital (HOMO) energy level of the first polymer light-emitting layer is in the range of 5.0 eV through 5.4 eV, and the HOMO energy level of the second polymer light-emitting layer is higher than the HOMO energy level of the first polymer light-emitting layer. The HOMO energy level of the second polymer light-emitting layer can be in the range of 5.4 eV through 5.8 eV.

The first polymer light-emitting layer may emit light in the orange-red color region of the visible spectrum, and the second polymer light-emitting layer may emit light in the blue color region of the visible spectrum.

An energy band gap, which is defined as a difference between the HOMO energy level and the lowest unoccupied molecular orbital (LUMO) energy level, of the first polymer light-emitting layer is in the range of 1.9 eV through 2.2 eV. The energy band gap of the second polymer light-emitting layer is larger than the energy band gap of the first polymer light-emitting layer, and can be larger than 2.5 eV.

A white organic EL device can include a third polymer light-emitting layer between the first and second polymer light-emitting layers. The third polymer light-emitting layer may emit light in the green color region of the visible spectrum. The HOMO energy level of the third polymer light-emitting layer is higher than the HOMO energy level of the first polymer light-emitting layer, and is lower than the HOMO energy level of the second polymer light-emitting layer. The energy band gap between the HOMO energy level and the LUMO energy level of the third polymer light-emitting layer can be in the range of 2.2 eV through 2.5 eV.

The present invention also provides a method of manufacturing a white organic EL device. The method includes a step of forming a first polymer light-emitting layer on a first electrode from a solution containing a first polymer material, and a step of forming a second polymer light-emitting layer on the first polymer light-emitting layer from a solution containing a second polymer material. Other layers, which is necessary to achieve the objective of the present invention, can be formed between the first electrode and the first polymer light-emitting layer, between the first polymer light-emitting layer and the second polymer light-emitting layer, or between the second polymer light-emitting layer and the second electrode. The HOMO energy level of the first polymer material can be in the range of 5.0 eV through 5.4 eV, and the HOMO energy level of the second polymer material can be higher than the HOMO energy level of the first light-emitting layer, which can be in the range of 5.4 eV through 5.8 eV. An energy band gap between the HOMO energy level and the LUMO energy level of the first polymer material can be in the range of 1.9 eV through 2.2 eV. An energy band gap of the second polymer material can be larger than the energy band gap of the first light-emitting layer, which can be larger than 2.5 eV.

A first polymer light-emitting layer can be made of a compound represented by Formula 1 (Compound 1), and a second polymer light-emitting layer can be made of a compound represented by Formula 2 (Compound 2). Compound 1 shown in Formula 1 is poly{2-(4'-dimethyldodecylsilylphenyl)-1,4-phenylene vinylene}, and Compound 2 shown in Formula 2 is poly(2',3',6',7'-tetraoctyloxispirofluorene)-co-phenoxazine. In the Formulae 1 and 2, n and m are real numbers from 0.01 to 0.99.

<Formula 1>

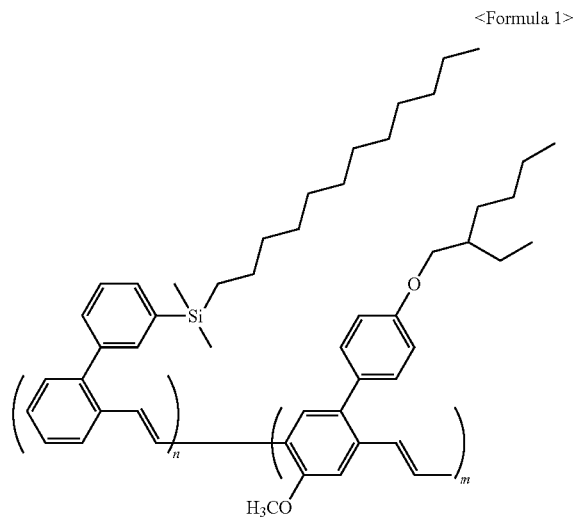

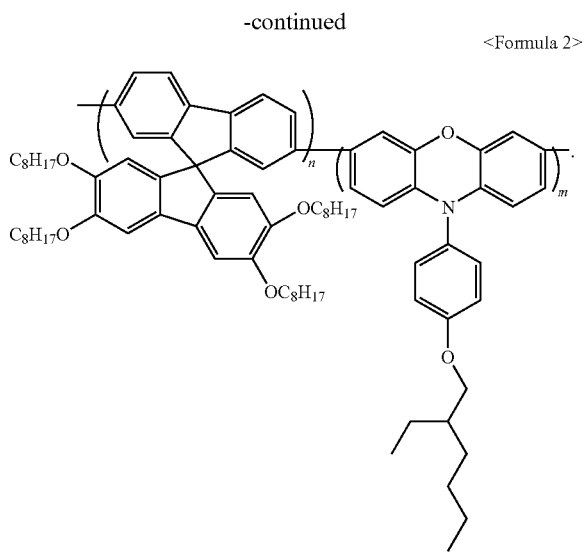

<Formula 2>

In the compound represented by Formula 1 (Compound 1), the HOMO energy level is 5.20 eV, the LUMO energy level is 3.07 eV, and the energy band gap is 2.13 eV. In the compound represented by Formula 2 (Compound 2), the HOMO energy level is 5.46 eV, the LUMO energy level is 2.73 eV, and the energy band gap is 2.73 eV. A third polymer light-emitting layer can be formed between the first polymer light-emitting layer and the second polymer light-emitting layer.

The first polymer light-emitting layer may emit light in the orange-red color region of the visible spectrum, and the second polymer light-emitting layer may emit light in the blue color region of the visible spectrum. FIG. 1 is a graph showing the spectrum of UV absorption and photoluminescence (PL) of Compound 1 and Compound 2. The first polymer light-emitting layer can be formed of Compound 1 which is represented by Formula 1, and the second polymer light-emitting layer may be formed of Compound 2 which is represented by Formula 2. Referring to FIG. 1, it is shown that the PL of Compound 1 is in the red color region of the visible spectrum, and the PL of Compound 2 is in the blue color region of the visible spectrum.

According to an embodiment of the present invention, a white organic EL device is manufactured by forming a plurality of organic light-emitting layers, which includes a first polymer light-emitting layer and a second polymer light-emitting layer. The organic EL device can include another layers such as an electron transport layer (ETL) and a hole transport layer (HTL) in addition to the organic light-emitting layers. Another layers are made of organic compounds and disposed between two electrodes (a first electrode and a second electrode) included in the white organic EL device. The thickness of the organic light-emitting layers, including ETL and HTL, is approximately in the range 50 nm through 100 nm.

A white organic EL devices can have various structures. One structure of the white organic EL devices includes an anode, a first polymer light-emitting layer, a second polymer light-emitting layer, and a cathode. Another structure of the white organic EL devices includes an anode, a buffer layer, a first polymer light-emitting layer, a second polymer light-emitting layer, and a cathode. Again another structure of the white organic EL devices includes an anode, a hole transport layer (HTL), a first polymer light-emitting layer, a second polymer light-emitting layer, and a cathode. Again another structure of the white organic EL devices includes an anode, a buffer layer, a HTL, a first polymer light-emitting layer, a second polymer light-emitting layer, and a cathode. Again another structure of the white organic EL devices includes an anode, a buffer layer, a HTL, a first polymer light-emitting layer, a second polymer light-emitting layer, an electron transport layer (ETL), and a cathode. Again another structure of the white organic EL devices includes an anode, a buffer layer, a HTL, a first polymer light-emitting layer, a second polymer light-emitting layer, an ETL, and a cathode. Again another structure of the white organic EL devices includes an anode, a buffer layer, a HTL, a first polymer light-emitting layer, a second polymer light-emitting layer, a hole blocking layer, an ETL, and a cathode.

FIGS. 2A and 2B illustrate sectional views of white organic EL devices constructed as embodiments of the present invention. In the white organic EL devices shown in FIG. 2A, an anode (a first electrode) is formed on a substrate, a hole injection layer (HIL) is formed on the anode, a first polymer light-emitting layer is formed on the HIL, a second polymer light-emitting layer is formed on the first polymer light-emitting layer, and a cathode (a second electrode) is formed on the second polymer light-emitting layer. In the white organic EL devices shown in FIG. 2B, an anode (a first electrode) is formed on a substrate, a HIL is formed on the anode, a first polymer light-emitting layer is formed on the HIL, a third polymer light-emitting layer is formed on the first polymer light-emitting layer, a second polymer light-emitting layer is formed on the third polymer light-emitting layer, and a cathode (a second electrode) is formed on the second polymer light-emitting layer. The structures shown in FIGS. 2A and 2B are examples of the structures of the white organic EL devices, and the present invention is not restricted to these structures. The principles of the present invention can be also applied to white organic EL devices that include another layers in addition to the layers shown in FIGS. 2A and 2B.

A white organic EL device can further include a buffer layer, a hole transport layer (HTL), an electron transport layer (ETL), or a hole blocking layer. The buffer layer can be made of a material such as copper phthalocyanine, polythiophene, polyaniline, polyacetylene, polypyrrole, polyphenylene vinylene, or derivatives thereof, but the present invention is not limited thereto. The HTL can be made of a material such as polytriphenylamine, but the present invention is not limited thereto. The ETL can be made of a material such as polyoxadiazole, but the present invention is not limited thereto. The hole blocking layer can be made of a material such as lithium fluoride (LiF), barium fluoride ($BaF_2$), or magnesium fluoride ($MgF_2$), but the present invention is not limited thereto.

Hereinafter, the present invention will be described more specifically with reference to the following examples. However, these examples are provided for illustrative purposes only and are not intended to limit the scope of the invention.

Example 1

A transparent electrode substrate was obtained by sputtering indium-tin oxide (ITO) on a glass substrate, and the transparent electrode substrate was cleaned. Then the ITO was patterned to obtain desired electrode patterns through a photolithography process that uses a photoresist resin and an etchant. The ITO pattern was cleaned. In order to form a conductive buffer layer, the surface of the ITO layer was coated with Batron P 4083 of Bayer Corporation to a thickness of about 500 Å and baked at 200° C. for about 10 minutes.

A solution for a first polymer light-emitting layer was obtained by dissolving 0.05 g of poly{2-(4'-dimethyldodecylsilylphenyl)-1,4-phenylene vinylene} in 5 g of toluene. The surface of the conductive buffer layer was spin-coated with the solution for a first polymer light-emitting layer, and baked to form a first polymer light-emitting layer.

A solution for a second polymer light-emitting layer was obtained by dissolving 0.05 g of poly(2',3',6',7'-tetraoctyloxispirofluorene)-co-phenoxazine in 5 g of toluene. The first polymer light-emitting layer was spin-coated with the solution for a second polymer light-emitting layer, and baked to form a second polymer light-emitting layer.

Before the spin-coating processes, both solutions for the first and the second polymer light-emitting layers were filtered with a 0.2 μm filter. The thicknesses of the first and the second polymer light-emitting layers were controlled to be approximately 10 nm and 80 nm, respectively. The thicknesses of the first and the second polymer light-emitting layers were controlled by the concentrations of solutions for the first and second polymer light-emitting layers and by the spinning speed.

The fabrication of a white organic EL device was completed by sequentially depositing barium fluoride ($BaF_2$), calcium (Ca), and aluminum (Al) on the polymer light-emitting layer in a vacuum below $4 \times 10^{-6}$ torr. The thickness of the layers and the deposition rate were controlled by a crystal sensor. The white organic EL device manufactured through the above processes has a layer structure in order of ITO, PEDOT, a first polymer light-emitting layer, a second polymer light-emitting layer, a barium fluoride ($BaF_2$) layer, a calcium (Ca) layer, and an aluminum (Al) layer, and has an emitting area of 6 $mm^2$.

Example 2

In Example 2, a white organic EL device was manufactured through the process described in Example 1 except that the thickness of a first polymer light-emitting layer was set to about 30 nm.

Example 3

In Example 3, a white organic EL device was manufactured through the process described in Example 1 except that the thickness of a first polymer light-emitting layer was set to about 40 nm.

Comparative Example 1

A transparent electrode substrate was obtained by sputtering indium-tin oxide (ITO) on a glass substrate, and was cleaned. Then, the ITO was patterned to obtain desired patterns through a photolithography process that uses a photoresist resin and an etchant. A patterned ITO layer was obtained, and the ITO layer was cleaned. To form a conductive buffer layer, the surface of the ITO layer was coated with Batron P 4083 of Bayer Corporation to a thickness of about 500 Å and baked at 200° C. for about 10 minutes.

Then a solution for polymer light-emitting layer was obtained by dissolving 0.05 g of poly{2-(4'-dimethyldodecylsilylphenyl)-1,4-phenylene vinylene} in 5 g of toluene. The surface of the conductive buffer layer was spin-coated with the solution for polymer light-emitting layer, and a polymer light-emitting layer was formed.

Before the coating process, the solution for polymer light-emitting layer was filtered with a 0.2 μm filter. The thickness of the polymer light-emitting layer was set to 80 nm by controlling the concentration of the solution for polymer light-emitting layer and the spinning speed.

The formation of a white organic EL device was completed by sequentially depositing calcium (Ca) and aluminum (Al) on the polymer light-emitting layer, in a vacuum below $4 \times 10^{-6}$ torr. The thickness of the layers and the deposition rate were controlled by a crystal sensor. The EL device manufactured in this process was a single-layer type device having a layer structure in order of ITO, PEDOT, a polymer light-emitting layer, a calcium (Ca) layer, and an aluminum (Al) layer. The EL device manufactured in this process has an emitting area of 6 $mm^2$.

Comparative Example 2

In Comparative Example 2, a white organic EL device was manufactured through the process described in Comparative Example 1 except that poly(2',3',6',7'-tetraoctyloxyspirofluorene)-co-phenoxazine was used for a first polymer light-emitting layer.

Evaluation

The maximum efficiency, color purity, and turn-on voltage of the EL devices of Examples 1, 2, and 3, and Comparative Examples 1 and 2 were evaluated, and the results are presented in Table 1.

TABLE 1

| | Features of EL devices | | |
|---|---|---|---|
| | Maximum Efficiency(cd/A) | Color Purity(x, y) | Turn-on Voltage(V) |
| Example 1 | 1.24 | 0.34, 0.36 | 4.0 |
| Example 2 | 1.25 | 0.40, 0.38 | 3.6 |
| Example 3 | 1.38 | 0.40, 0.38 | 3.8 |
| Comparative Example 1 | 2.9 | 0.18, 0.32 | 2.8 |
| Comparative Example 2 | 0.9 | 0.58, 0.37 | 2.2 |

Figure 3:
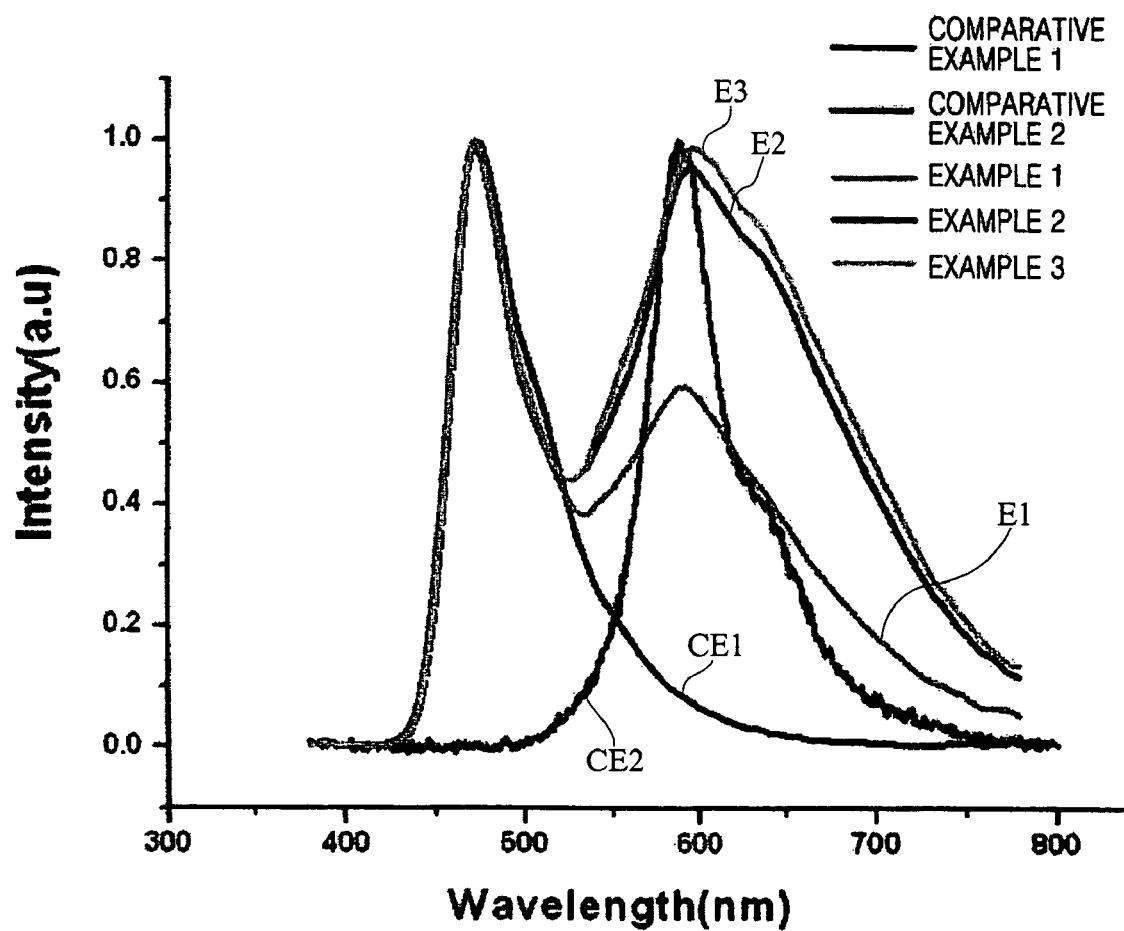
FIG. 3 is a graph showing the emission intensity of white organic EL devices manufactured according to the methods described in Examples 1, 2 and 3.

FIG. 3 shows graphs of the electroluminescence (EL) spectrum of the white organic electroluminescent (EL) devices manufactured in Examples 1, 2, and 3, and Comparative Examples 1 and 2. It should be noted that the EL devices of Examples 1, 2, and 3 have first polymer light-emitting layers with different thicknesses. Referring to FIG. 3, it is shown that the white organic EL devices of Example 1, 2, and 3 of the present invention emit light in both blue and red regions of the visible spectrum, while the EL devices of Comparative Examples 1 and 2 emit light in either blue or red region of the visible spectrum. It is also shown that the electroluminescence (EL) intensity in the red region of the visible spectrum increases as the thickness of the first polymer light-emitting layer increases.

As shown in Table 1, the maximum efficiency and the turn-on voltage depend on the number of polymer light-emitting layers and the thickness of the first polymer light-emitting layer. The desirable white color, however, is obtained in the EL devices manufactured in Examples 1, 2, and 3. As shown in Table 1, color purity, which represents the color coordinate, depends on the thickness of the first polymer light-emitting layer, and the experimental results show that an optimum color coordinate can be obtained by adjusting the thickness of the first light-emitting layer of the EL device manufactured according to the principles of the present invention.

Figure 4:
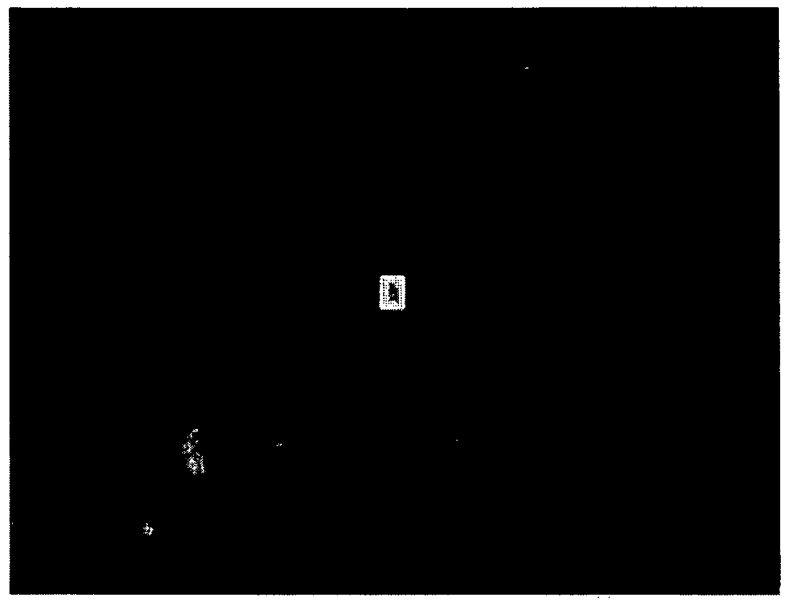
FIG. 4 is a photographic image showing white light emitted from a white organic EL device constructed as an embodiment of the present invention.

FIG. 4 is a photographic image showing white light emitted from the EL device manufactured as an embodiment of the present invention. The image of FIG. 4 demonstrates that a white organic EL device can be achieved from an structure having multiple polymer light-emitting layers.

Figure 5A:
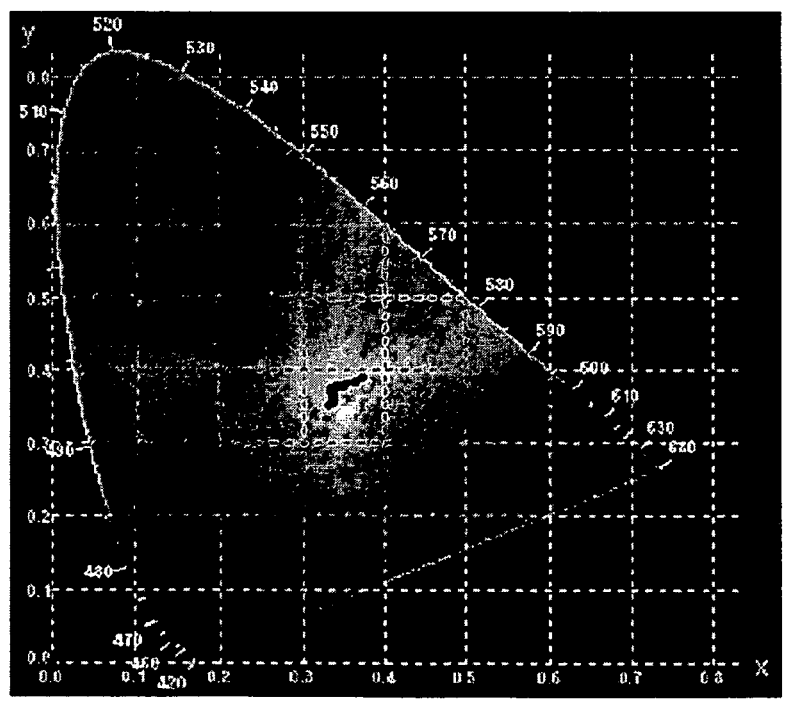
FIGS. 5A, 5B and 5C are images showing color coordinates of the EL devices manufactured in Examples 1, 2 and 3.
Figure 5B:
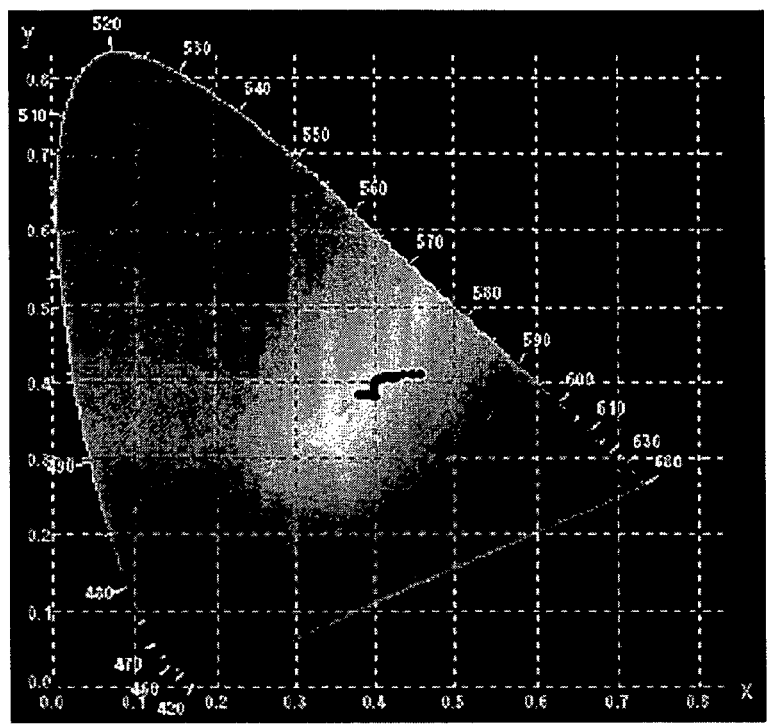
Figure 5C:
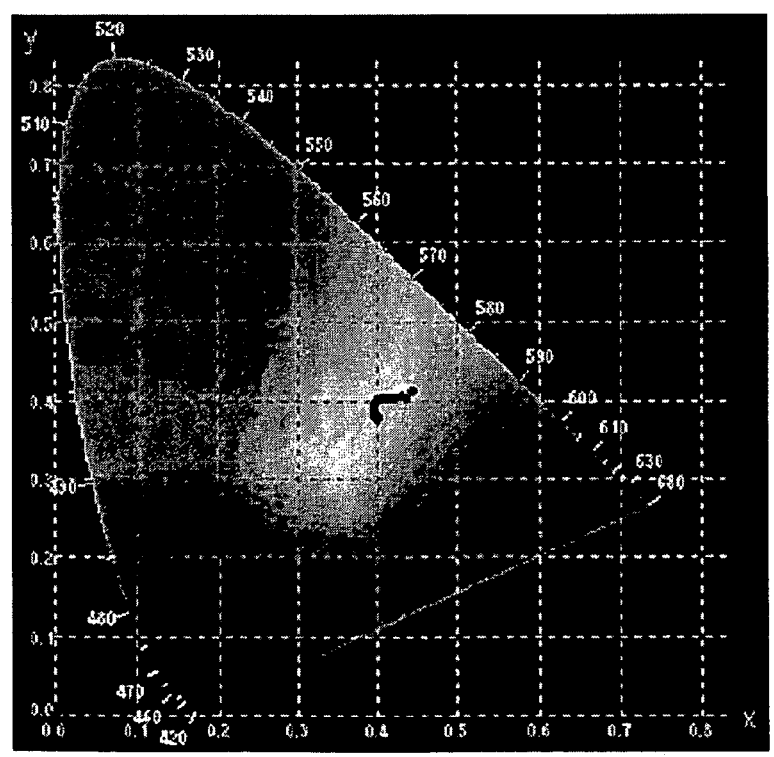

FIGS. 5A, 5B and 5C are photographic images showing color coordinates of the EL devices of Examples 1, 2 and 3, respectively. As shown in FIGS. 5A, 5B and 5C, the EL devices of Examples 1, 2 and 3 have the color coordinates around the white region. In order to further investigate the color characteristics of the EL devices of Examples 1, 2 and 3, voltage is applied to the EL devices of Examples 1, 2 and 3, and color coordinates of the EL devices are measured with respect to the applied voltage. The drifts of points in each photographic image of FIGS. 5A, 5B and 5C represent color changes with respect to the applied voltage in each EL device of Examples 1, 2 and 3, respectively. The color changes depending on the applied voltage is relatively small, which indicates that the white organic EL devices of Examples 1, 2 and 3 are well optimized to produce white color. Another fact that should be noted is that the EL devices of Examples 1, 2, and 3 have first polymer light-emitting layers with different thicknesses. As observed from images of FIGS. 5A, 5B and 5C, slight color change can be obtained by slightly changing the thickness of the first polymer light-emitting layer of the EL devices. Therefore, an optimum white color, which is required in a specific application, can be obtained by changing the thickness of the first polymer light-emitting layer, and stability of color performance also can be improved by controlling the thickness of a light-emitting layer.

As described above, a white organic EL device, which demonstrates excellent white color balance, can be manufactured by forming two or three polymer light-emitting layers, each of which emits red, green, or blue light, and by controlling the thickness of each light-emitting layer.

Moreover, the EL device, which emits white color, can be manufactured through a wet process. In the description of the embodiment of the present invention, a spin-coating process is described as method to form the polymer light-emitting layers, but other methods also can be employed to form the polymer light-emitting layers. As the materials for the polymer light-emitting layers are provided as a form of solution or liquid, the forming process of the polymer light-emitting layer is simpler than other methods, and manufacturing cost can be reduced. Even though the polymer light-emitting layers are made by the wet process, the EL devices with these polymer light-emitting layers show excellent color performance and stability. By the use of the wet process, thickness of the polymer light-emitting layer can be easily controlled, and desired color balance, which depends on applications of the EL device, can be easily achieved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white organic electroluminescent (EL) device comprising:
    a first electrode;
    a second electrode;
    a first polymer light-emitting layer disposed between the first electrode and the second electrode, a highest occupied molecular orbital (HOMO) energy level of the first polymer light-emitting layer being between 5.0 eV and 5.4 eV, an energy band gap of the first polymer light-emitting layer being between 1.9 eV and 2.2 eV; and
    a second polymer light-emitting layer disposed between the first polymer light-emitting layer and the second electrode, a highest occupied molecular orbital (HOMO) energy level of the second polymer light-emitting layer being no less than the HOMO energy level of the first polymer light-emitting layer, an energy band gap of the second polymer light-emitting layer being no less than 2.5 eV.

2. The white organic EL device of claim 1, wherein the HOMO energy level of the second polymer light-emitting layer is between 5.4 eV and 5.8 eV.

3. The white organic EL device of claim 1, further comprising a third polymer light-emitting layer disposed between the first polymer light-emitting layer and the second polymer light-emitting layer.

4. The white organic EL device of claim 3, wherein a highest occupied molecular orbital (HOMO) energy level of the third polymer light-emitting layer is higher than the HOMO energy level of the first polymer light-emitting layer, and is lower than the HOMO energy level of the second polymer light-emitting layer.

5. The white organic EL device of claim 3, wherein an energy band gap of the third polymer light-emitting layer is between 2.2 eV and 2.5 eV.

6. The white organic EL device of claim 1, wherein the first polymer light-emitting layer is formed of a compound represented by Formula 1 and the second polymer light-emitting layer is formed of a compound represented by Formula 2, where n and m in Formula 1 and Formula 2 are real numbers from 0.01 to 0.99.

Formula 1:

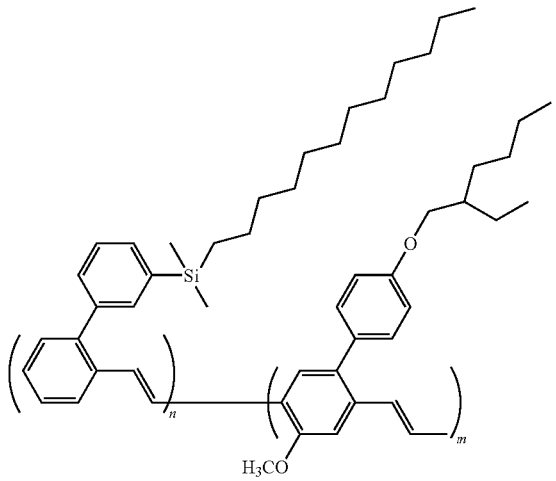

Formula 2:

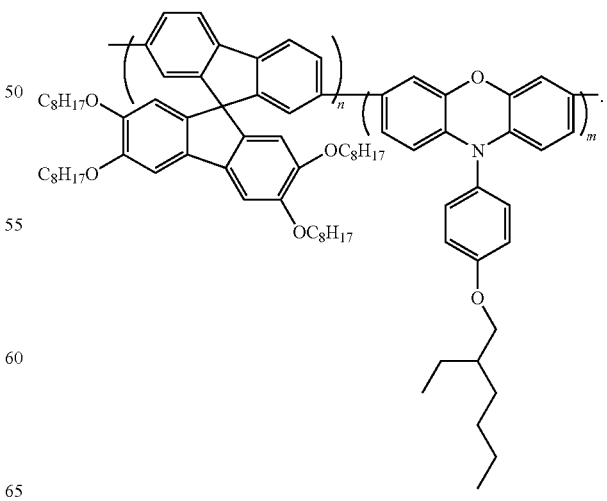

7. A white organic electroluminescent (EL) device comprising:
a first electrode;
a second electrode;
a first polymer light-emitting layer disposed between the first electrode and the second electrode, an energy band gap of the first polymer light-emitting layer being between 1.9 eV and 2.2 eV; and
a second polymer light-emitting layer disposed between the first polymer light-emitting layer and the second electrode, an energy band gap of the second polymer light-emitting layer being no less than 2.5 eV.

8. The white organic EL device of claim 7, wherein a highest occupied molecular orbital (HOMO) energy level of the first polymer light-emitting layer being between 5.0 eV and 5.4 eV.

9. The white organic EL device of claim 8, wherein the HOMO energy level of the second polymer light-emitting layer is between 5.4 eV and 5.8 eV.

10. The white organic EL device of claim 7, further comprising a third polymer light-emitting layer disposed between the first polymer light-emitting layer and the second polymer light-emitting layer, an energy band gap of the third polymer light-emitting layer being between 2.2 eV and 2.5 eV.

11. The white organic EL device of claim 10, wherein a highest occupied molecular orbital (HOMO) energy level of the third polymer light-emitting layer is higher than the HOMO energy level of the first polymer light-emitting layer, and is lower than the HOMO energy level of the second polymer light-emitting layer.

12. The white organic EL device of claim 7, wherein the first polymer light-emitting layer is formed of a compound represented by Formula 1 and the second polymer light-emitting layer is formed of a compound represented by Formula 2, where n and m in Formula 1 and Formula 2 are real numbers from 0.01 to 0.99.

Formula 1:

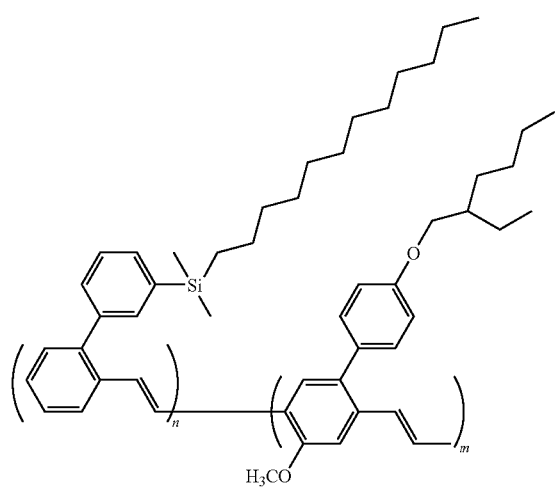

Formula 2:

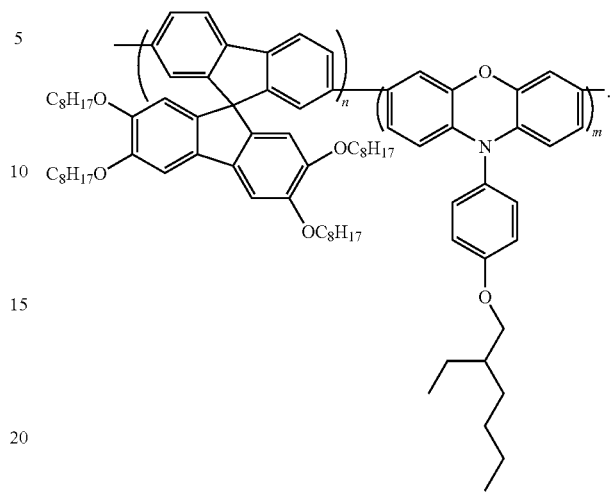

13. A method of manufacturing a white organic EL device, the method comprising:
preparing a substrate;
forming an electrode pattern on the substrate;
forming a first polymer light-emitting layer on the electrode pattern from a solution containing a first polymer material, a highest occupied molecular orbital (HOMO) energy level of the first polymer material being between 5.0 eV and 5.4 eV, an energy band gap of the first polymer light-emitting layer being between 1.9 eV and 2.2 eV; and
forming a second polymer light-emitting layer from a solution containing a second polymer material, a highest occupied molecular orbital (HOMO) energy level of the second polymer material being no less than the HOMO energy level of the first polymer material, an energy band gap of the second polymer light-emitting layer being no less than 2.5 eV.

14. The method of claim 13, wherein the HOMO energy level of the second polymer material is between 5.4 eV and 5.8 eV.

15. The method of claim 13, wherein the second polymer light-emitting layer being formed on the first polymer light-emitting layer.

16. The method of claim 13, further comprising:
forming a third polymer light-emitting layer on the first polymer light-emitting layer, the second polymer light-emitting layer being formed on the third polymer light-emitting layer.

17. The method of claim 13, wherein the first polymer material includes a compound represented by Formula 1 and the second polymer material includes a compound represented by Formula 2, where n and m in Formula 1 and Formula 2 are real numbers from 0.01 to 0.99.

Formula 1:
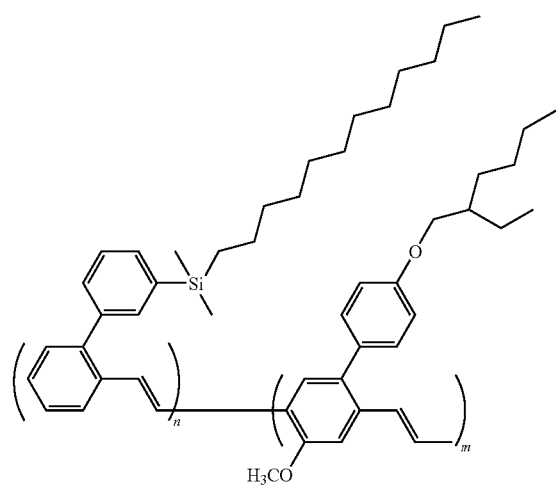
Formula 2:
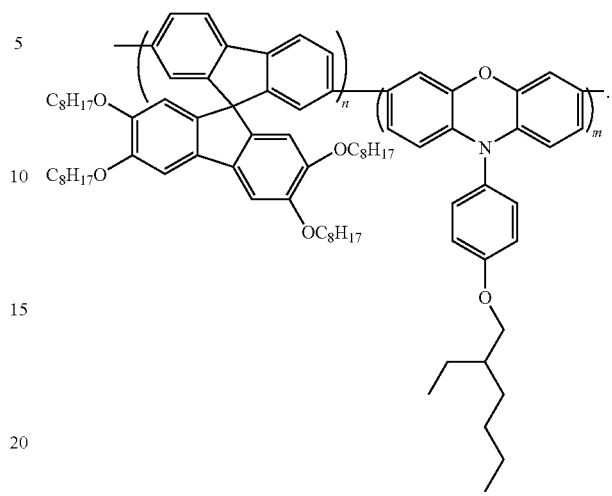
-continued
* * * * *